United States Patent
Hirai

(10) Patent No.: US 10,498,335 B2
(45) Date of Patent: Dec. 3, 2019

(54) INPUT APPARATUS, COMPUTER-READABLE RECORDING MEDIUM, AND DETECTION METHOD

(71) Applicant: FUJITSU TEN LIMITED, Kobe-shi, Hyogo (JP)

(72) Inventor: Seiji Hirai, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 131 days.

(21) Appl. No.: 15/667,884

(22) Filed: Aug. 3, 2017

(65) Prior Publication Data

US 2018/0062648 A1 Mar. 1, 2018

(30) Foreign Application Priority Data

Sep. 1, 2016 (JP) .................. 2016-170954

(51) Int. Cl.
*H03K 17/96* (2006.01)
*G06F 3/0484* (2013.01)

(52) U.S. Cl.
CPC ....... *H03K 17/962* (2013.01); *G06F 3/04847* (2013.01); *H03K 17/9622* (2013.01); *H03K 2217/96066* (2013.01); *H03K 2217/960705* (2013.01)

(58) Field of Classification Search
CPC ............. H03K 17/962; H03K 17/9622; H03K 2217/96066; H03K 2217/960705; G06F 3/03548; G06F 3/041–047; G06F 3/04847; G06F 3/0485
See application file for complete search history.

(56) References Cited

U.S. PATENT DOCUMENTS

| 8,436,494 B2 | 5/2013 | Yamauchi et al. |
| 2001/0043198 A1* | 11/2001 | Ludtke ................ G06F 3/04847 345/173 |
| 2003/0142081 A1* | 7/2003 | Iizuka ................... G06F 1/1626 345/173 |

FOREIGN PATENT DOCUMENTS

| JP | 2009-141819 A | 6/2009 |
| JP | 2012-123448 A | 6/2012 |

* cited by examiner

*Primary Examiner* — Stephen G Sherman
(74) *Attorney, Agent, or Firm* — Oliff PLC

(57) ABSTRACT

An input apparatus according to one aspect of an embodiment includes a contact detecting unit and an operation detecting unit. The contact detecting unit detects, with a predetermined period, a switch having a contact with a user among a plurality of arrayed switches. The operation detecting unit detects a touch operation or a slide operation on the basis of a distance between the switch detected at the present time and the switch detected at the last time.

8 Claims, 10 Drawing Sheets

FIG.9

| DISTANCE D12 | DISTANCE D02 | INPUT OPERATION |
|---|---|---|
| D12=0 | | TOUCH OPERATION |
| 0<D12<Th1 | D02<Th2 | TOUCH OPERATION |
| | D02≥Th2 | SLIDE OPERATION |
| D12≥Th1 | | SLIDE OPERATION |

INPUT APPARATUS, COMPUTER-READABLE RECORDING MEDIUM, AND DETECTION METHOD

CROSS-REFERENCE TO RELATED APPLICATION

This application is based upon and claims the benefit of priority of the prior Japanese Patent Application No. 2016-170954, filed on Sep. 1, 2016, the entire contents of which are incorporated herein by reference.

FIELD

The embodiment discussed herein is directed to an input apparatus, a computer-readable recording medium, and a detection method.

BACKGROUND

Conventionally, there exist, as an apparatus that detects a contact between a specific part and a finger of a user and the like, an apparatus that detects this contact on the basis of change in electrostatic capacity between a finger of a user and a sensor. This apparatus determines whether or not an external device is to be operated on the basis of a signal according to the change in electrostatic capacity output from the sensor (see Japanese Laid-open Patent Publication No. 2009-141819, for example).

However, the conventional apparatus determines whether or not an external device is to be operated on the basis of one sensor, and accepting an operation of a user by using a plurality of sensors is not considered. Thus, when a plurality of sensors is used, there exists room for improvement in improving operability of a user.

SUMMARY

An input apparatus according to an embodiment includes a contact detecting unit and an operation detecting unit. The contact detecting unit detects, with a predetermined period, a switch having a contact with a user among a plurality of switches that is arrayed. The operation detecting unit detects a touch operation or a slide operation based on a distance between the switch detected at the present time and the switch detected at the last time.

BRIEF DESCRIPTION OF DRAWINGS

A more complete appreciation of the disclosed technology and many of the attendant advantages thereof will be readily obtained as the same becomes better understood by reference to the following detailed description when considered in connection with the accompanying drawings, wherein:

FIG. 9 is a table illustrating correspondence relation between distances between the virtual switches and the input operations to be detected by the operation detecting unit according to the embodiment;

DESCRIPTION OF EMBODIMENT

Hereinafter, an embodiment of an input apparatus, a computer-readable recording medium, and a detection method will be described in detail with reference to the accompanying drawings. Moreover, the embodiment described below is merely one example, and not intended to limit the present disclosure.

Figure 1A:
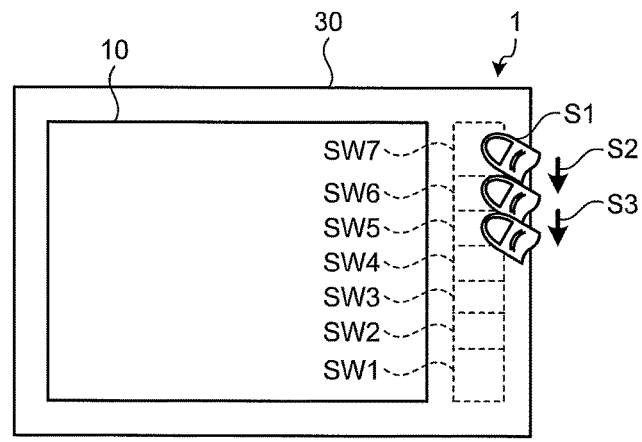
FIG. 1A is a diagram illustrating an outline of an information processing system according to an embodiment.
Figure 1B:
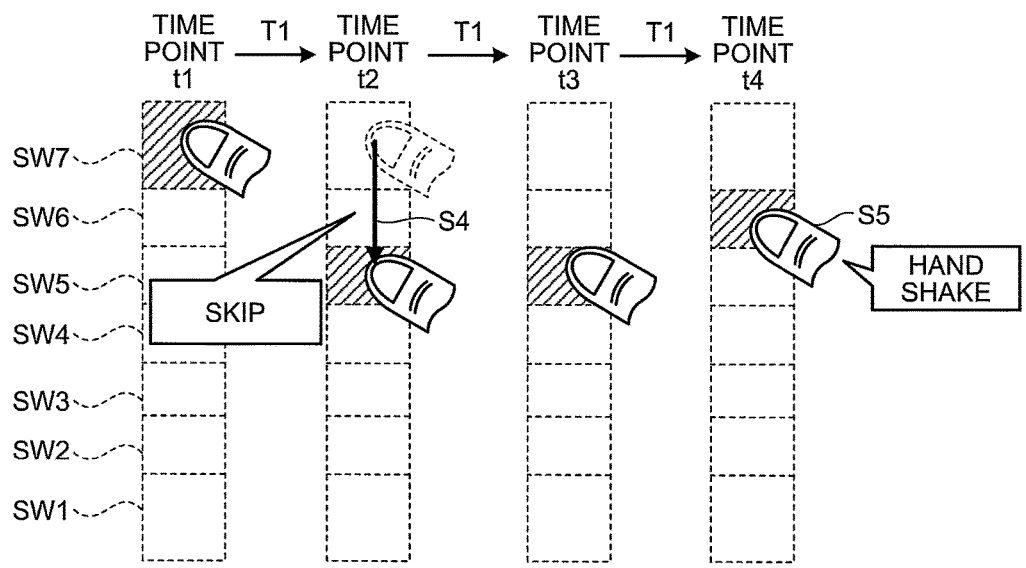
FIG. 1B is a diagram illustrating a detection method to be performed by an input apparatus included in the information processing system according to the embodiment.

First, an outline of an information processing system 1 according to the present embodiment will be explained with reference to FIGS. 1A and 1B. FIG. 1A is a diagram illustrating the outline of the information processing system 1 according to the embodiment of the present disclosure. FIG. 1B is a diagram illustrating a detection method to be performed by an input apparatus 30 included in the information processing system 1.

As illustrated in FIG. 1A, the information processing system 1 includes a display device 10 and the input apparatus 30. The information processing system 1 is, for example, an on-vehicle system mounted on a vehicle. A target on which the information processing system 1 is mounted is not limited to a vehicle. The information processing system 1 may be mounted on, for example, a smartphone, a tablet terminal, etc.

The display device 10 is, for example, a liquid crystal display and the like, and is fixed to an instrument panel of a vehicle. The display device 10 is connected with a navigation apparatus (not illustrated) and the like so as to display an image of navigation information, map information, television broadcast, etc. in accordance with an input operation from a user which is accepted through, for example, the input apparatus 30. For example, when the input apparatus 30 accepts a slide operation, the display device 10 displays, for example, up-scaled or down-scaled map information, namely, controls an image to be displayed in accordance with the input operation accepted by the input apparatus 30.

The input apparatus 30 includes a plurality of switches SW1 to SW7 (hereinafter, may be referred to as "switches SW"). The switches SW1 to SW7 are arranged so that the switches SW1 to SW7 are in line along a side of the display device 10 at a periphery (right side in FIG. 1A) of the display device 10. The switches SW1 to SW7 have no difference in level, and are formed integrally with, for example, a front panel of the display device 10 and an instrument panel of a vehicle. Each of the switches SW1 to SW7 is, for example, an electrostatic capacity-type switch so as to detect a contact with a finger of a user and the like.

The input apparatus 30 detects, with a predetermined period T1, any of the switches SW1 to SW7 that contact with a user on the basis of detection results of the switches SW1 to SW7. For example, when detecting a contact between the one switch SW7 and the user for the plurality of periods, the input apparatus 30 detects a touch operation of the switch SW7 (Step S1).

Alternatively, when detecting sequential contacts of a user with, for example, the switches SW7→SW6→SW5, the input apparatus 30 detects a slide operation from the switch SW7 to the switch SW6 (Step S2), and further detects a slide operation from the switch SW6 to the switch SW5 (Step S3).

Thus, the input apparatus 30 detects a touch operation or a slide operation in accordance with whether or not the input apparatus 30 sequentially detects the switches SW1 to SW7 so as to accept the touch operation or the slide operation of the user.

Herein, for example, when a slide operation of a user is fast, as illustrated in FIG. 1B, the input apparatus 30 detects in some cases a contact between the switch SW7 and the user at a time point t1, and further detects a contact with the switch SW5 at a time point t2 when the predetermined period T1 is elapsed from the time point t1. In other words, the input apparatus 30 skips a contact with the switch SW6 in some cases. In FIG. 1B, a configuration needed for explanation is illustrated, and illustration of other configurations is omitted. In FIG. 1B, illustration of reference symbols of the same configuration at different time points is omitted.

As illustrated in FIG. 1A, in a case where a touch operation or a slide operation is detected in accordance with only whether or not the switches SW1 to SW7 are sequentially detected, the input apparatus 30 does not detect a slide operation when a skip occurs.

In a case where hand shake occurs due to effects of vibration of a vehicle and the like when a user touches the switch SW5, the user erroneously contacts with the switch SW6 in some cases. In this case, the input apparatus 30 detects a contact between the switch SW5 and a user at a time point t3, and then further detects a contact with the switch SW6 at a next time point t4.

As illustrated in FIG. 1A, in a case where a touch operation or a slide operation is detected in accordance with only whether or not the switches SW1 to SW7 are sequentially detected, the input apparatus 30 detects contacts with a user in the order of the switches SW5→SW6 so as to erroneously detect a slide operation from the switch SW5 to the switch SW6.

Thus, the input apparatus 30 is configured to detect a slide operation when the switch SW having a contact with a user moves one by one, there exists a fear that a slide operation is not detected and a touch operation is erroneously detected as a slide operation, depending on an operation of the user.

Therefore, the input apparatus 30 according to the present embodiment configured to detect, when the switch SW detected at the present time is different form that detected at the last time, a slide operation or a touch operation in accordance with a distance between the switch SW detected at the present time and that detected at the last time.

Thus, erroneous detection of an operation and the like by the input apparatus 30 can be reduced, so that it is possible to improve operability of the input apparatus 30.

Specifically, for example, as illustrated in FIG. 1B, the input apparatus 30 compares a distance D12 (herein, two-switch distance) from the switch SW5 detected at the present time point t2 to the switch SW7 detected at the last time point t1 with a first threshold Th1. Herein, the first threshold Th1 is set to be a two-switch distance. In this case, the distance D12 is equal to or more than the first threshold Th1, and thus the input apparatus 30 detects a slide operation (Step S4).

Thus, the input apparatus 30 can detect a slide operation of a user even when the switch SW6 is skipped.

For example, as illustrated in FIG. 1B, the input apparatus 30 compares a distance D34 (herein, one-switch distance) from the switch SW5 detected at the time point t3 to the switch SW6 detected at the time point t4 with the first threshold Th1. When the distance D34 is less than the first threshold Th1, the input apparatus 30 detects a touch operation in accordance with the switch SW5 detected at the last but one time (for example, time point t2) (Step S5). Details of a method for detecting a touch operation will be mentioned later with reference to FIGS. 6A and 6B.

Herein, a touch operation is detected while a user contacts with one of the switches SW1 to SW7 and a slide operation is detected while the contact moves over the switches SW1 to SW7. In other words, the touch operation includes an operation of one light touch with any of the switches SW1 to SW7 and an operation of a long-time touch with any of the switches SW1 to SW7, so-called long push.

As described above, the input apparatus 30 according to the present embodiment can detect an operation performed by a user with high accuracy even when a skip of any of the switches SW1 to SW7 occurs, or hand shake of the user occurs. Thus, the input apparatus 30 can improve operability of a user.

Figure 2:
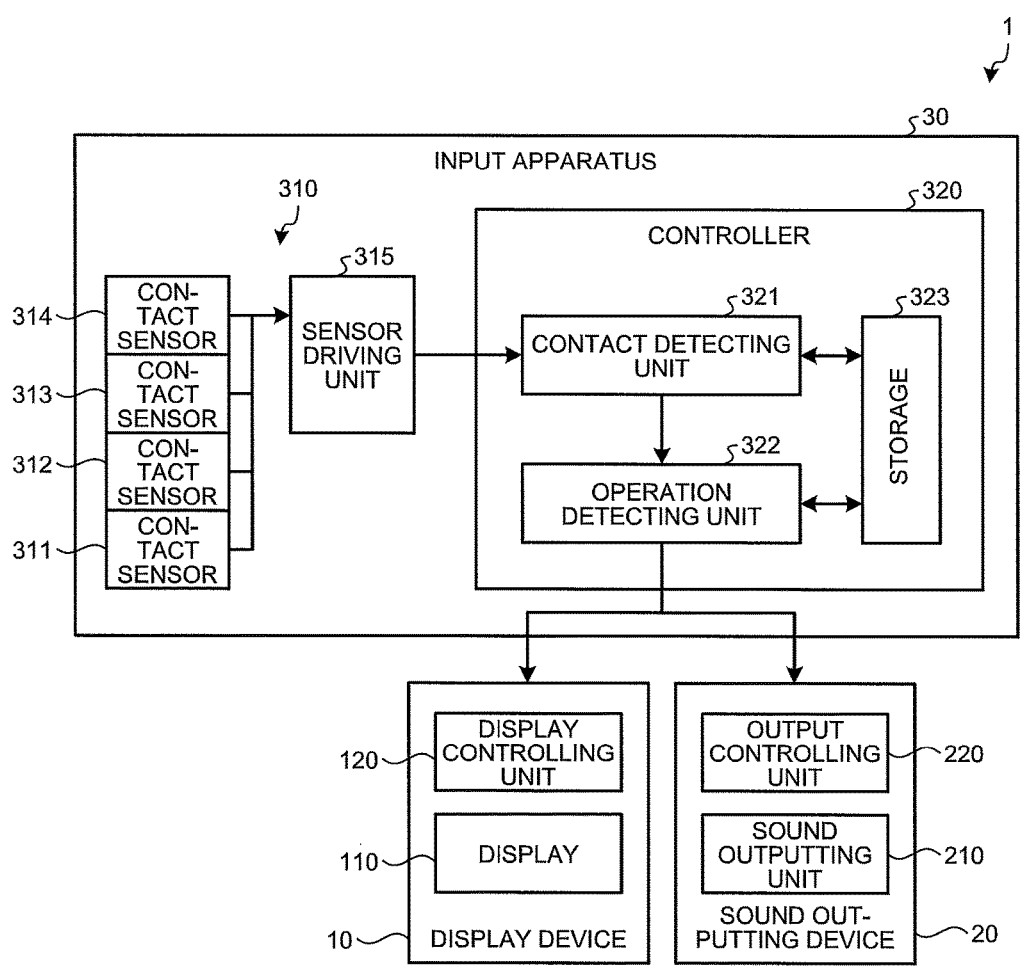
FIG. 2 is a block diagram illustrating a configuration of the information processing system according to the embodiment.

Next, details of the information processing system 1 according to the present embodiment will be explained with reference to FIG. 2. FIG. 2 is a block diagram illustrating a configuration of the information processing system 1 according to the embodiment of the present disclosure. Configuration elements needed for explaining features of the present embodiment are illustrated by using functional blocks, and illustration of common configuration elements is omitted.

In other words, specific forms of distribution and integration of the configuration elements illustrated in FIG. 2 are not limited to those illustrated in the drawings, and all or some of the devices can be configured by separating or integrating the apparatus functionally or physically in any unit, according to various types of loads, the status of use, etc.

As illustrated in FIG. 2, the information processing system 1 includes the display device 10, a sound outputting device 20, and the input apparatus 30.

The display device 10 includes a display 110 and a display controlling unit 120. The display 110 includes, for example, a liquid crystal display and the like, and is fixed to an instrument panel of a vehicle. The display controlling unit 120 generates an image to be displayed on the display 110 on the basis of, for example, operation contents from a user accepted by the input apparatus 30, and outputs the image to the display 110. The display controlling unit 120 controls the display 110 so as to cause the display 110 to exhibit the image to the user.

The sound outputting device 20 is for example an audio device. The sound outputting device 20 includes a sound outputting unit 210 and an output controlling unit 220. The sound outputting unit 210 includes a speaker that outputs sound to the inside of the vehicle, and specifically is used for sound guidance in a route guiding service of a car navigation apparatus, information provision using other sound, and outputting music contents.

The output controlling unit 220 generates sound data to be output to the sound outputting unit 210 on the basis of, for example, operation contents from a user accepted by the input apparatus 30 and outputs the sound data to the sound outputting unit 210 so as to control the sound outputting unit 210 to output sound to the user. The output controlling unit 220 adjusts volume of the sound output from the sound outputting unit 210 on the basis of, for example, operation contents from a user accepted by the input apparatus 30.

The input apparatus 30 accepts an input operation by a user, and outputs a signal according to this input operation of the user to the display device 10 and the sound outputting device 20. When the input apparatus 30 outputs the input operation to the display device 10 and the sound outputting device 20, the display device 10 and the sound outputting device 20 performs control of, for example, scaling of a screen, volume adjustment, and the like, in accordance with the accepted input operation. Alternatively, the input apparatus 30 may output the input operation of the user to any of the display device 10 and the sound outputting device 20, which accepts the input operation. The input apparatus 30 includes a sensor unit 310 and a controller 320.

The sensor unit 310 detects presence/absence of a contact with a user and outputs a detection result to the controller 320. The sensor unit 310 includes a plurality of contact sensors 311 to 314 and a sensor driving unit 315.

Figure 3:
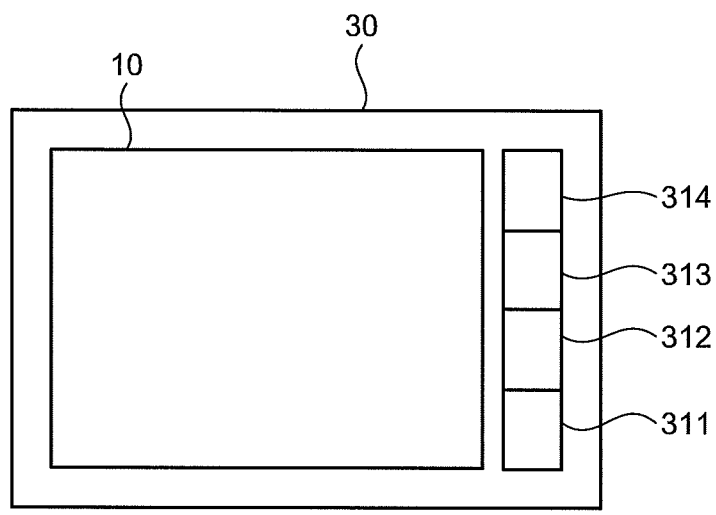
FIG. 3 is a diagram illustrating an arrangement example of a plurality of contact sensors according to the embodiment.

As illustrated in FIG. 3, the plurality of contact sensors 311 to 314 is arranged so that they are in line along a side of the display device 10. The plurality of contact sensors 311 to 314 has no difference in level, and is formed integrally with, for example, a front panel of the display device 10 and an instrument panel of a vehicle. Each of the plurality of contact sensors 311 to 314 includes, for example, an electrostatic capacity-type sensor, and outputs a signal according to presence/absence of a contact with a user to the sensor driving unit 315. FIG. 3 is a diagram illustrating an arrangement example of the plurality of contact sensors 311 to 314.

Returning to FIG. 2, the sensor driving unit 315 includes, for example, an amplifier and an Analog/Digital (A/D) converter (not illustrated). The sensor driving unit 315 performs, with the predetermined period T1, amplification and A/D conversion on the signal input from any of the contact sensors 311 to 314, and outputs the computed signal to the controller 320.

The controller 320 is a microcomputer including a Central Processing Unit (CPU) and a storage 323, and controls a whole of the input apparatus 30. The controller 320 is mounted on, for example, an Electric Control Unit (ECU). The controller 320 includes a contact detecting unit 321 and an operation detecting unit 322 as functions realized in a software manner by the microcomputer.

Figure 4A:
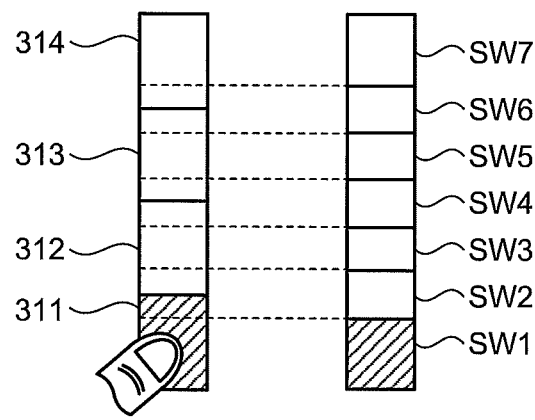
FIGS. 4A and 4B are diagrams illustrating correspondence relation between the plurality of contact sensors and a plurality of virtual switches according to the embodiment.
Figure 4B:
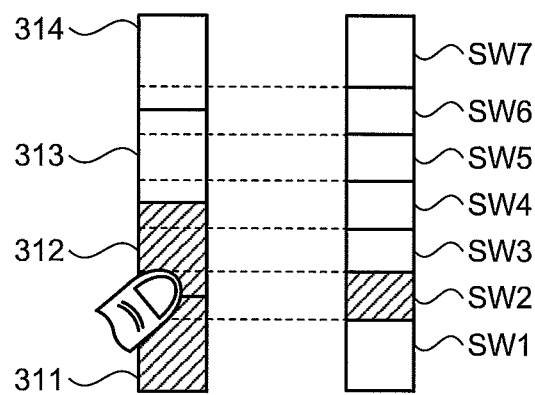

The contact detecting unit 321 detects any of the plurality of switches SW1 to SW7, which has a contact with a user, on the basis of the detection result of the sensor unit 310. Herein, the plurality of switches SW1 to SW7 is not physically-arranged hardware switches, and is "virtual switches" that are virtually arranged corresponding to the plurality of contact sensors 311 to 314. Hereinafter, the plurality of virtual switches SW1 to SW7 will be explained with reference to FIGS. 4A and 4B. FIGS. 4A and 4B are diagrams illustrating correspondence relation between the plurality of contact sensors 311 to 314 and the plurality of virtual switches SW1 to SW7.

The plurality of virtual switches SW1 to SW7 is arranged in line. Each of the plurality of virtual switches SW1 to SW7 is associated with one or adjacent two of the contact sensors 311 to 314. When one contact sensor detects a contact with a user, or when adjacent two contact sensors simultaneously detect the contact, the corresponding virtual switch SW detects the contact with the user.

The virtual switches SW1, SW3, SW5, and SW7 correspond to the contact sensors 311 to 314, respectively. The virtual switches SW2, SW4, and SW6 correspond to adjacent two contact sensors of the contact sensors 311 to 314, respectively.

For example, the successively-arranged virtual switches SW1 to SW3 (first to third switches) correspond to the contact sensors 311 and 312 (first and second contact sensors). Specifically, the virtual switch SW1 corresponds to the contact sensor 311. The virtual switch SW2 corresponds to the contact sensors 311 and 312. The virtual switch SW3 corresponds to the contact sensor 312.

In other words, as illustrated in FIG. 4A, when the contact sensor 311 detects a contact with a user, the virtual switch SW1 detects the contact with the user. As illustrated in FIG. 4B, when the contact sensors 311 and 312 simultaneously detect a contact with a user, the virtual switch SW2 arranged between the virtual switches SW1 and SW3 detect the contact with the user. In FIGS. 4A and 4B, each of the contact sensors having a contact with a user and the corresponding virtual switch SW are indicated by using diagonal lines.

Thus, association of one or more of the contact sensors 311 to 314 with each of the virtual switches SW1 to SW7 causes the number of the virtual switches SW1 to SW7 that detect a contact with a user to be larger than that of the contact sensors 311 to 314. Thus, resolution of the virtual switches SW1 to SW7 can be improved while reducing the number of the contact sensors 311 to 314.

Returning to FIG. 2, the contact detecting unit 321 detects, with the predetermined period T1, any of the virtual switches SW1 to SW7, which has a contact with a user, on the basis of a signal, which is input from the sensor driving unit 315, indicating presence/absence of the contact between each of the contact sensors 311 to 314 and the user. The contact detecting unit 321 outputs the detection result to the operation detecting unit 322. As described below, when the operation detecting unit 322 detects, caused by hand shake and the like, a touch operation of the virtual switch SW detected at a last time point, the contact detecting unit 321 sets the virtual switch SW detected at the last time point t0 be the virtual switch SW detected at the present time.

The operation detecting unit 322 detects an input operation performed by a user in accordance with a detection result of the contact detecting unit 321. The operation detecting unit 322 detects a touch operation of, for example, a contact between a user and the one virtual switch SW. The operation detecting unit 322 further detects, for example, a slide operation of a slide of a finger of a user and the like over the plurality of virtual switches SW1 to SW7.

The operation detecting unit 322 outputs the detected input operation to the display device 10 or the sound outputting device 20. The display device 10 or the sound outputting device 20 controls images and sound data to be exhibited to the user by changing a specific control value in accordance with the operation detected by the operation detecting unit 322. The display device 10 or the sound outputting device 20 changes the specific control value by a predetermined value based on detection of the touch operation of one switch among a plurality of switches SW1 to SW7, and changes the specific control value in response to the distance between switches in the slide operation, based on detection of the slide operation including the one switch. For example, the specific control value is a control value that controls display contents of images, a control value of a sound volume of the audio device, etc.

For example, it is assumed that the operation detecting unit 322 detects a slide operation while a list of music contents and the like is displayed on the display 110. In this case, the display device 10 scrolls the list of music contents and the like to display the scrolled list on the display 110. Alternatively, when a slide operation is detected in such a state where predetermined music contents are selected, the display device 10 may select other music contents in response to the slide operation.

Volume of sound data to be output from the sound outputting device 20 in response to the slide operation may be adjusted. Alternatively, a frequency of radio broadcast may be changed, or a reproduction position of moving images or sound data may be changed, in response to the slide operation. Moreover, an external device (not illustrated) may be controlled, for example, a set temperature of an air conditioner may be controlled.

Input operations to be detected by the operation detecting unit 322 will be explained with reference to FIGS. 5 to 10. As described above, the operation detecting unit 322 detects slide operations and touch operations. The slide operations include that in a case where the virtual switches SW are successively and sequentially detected without a skip (skip absence), and that in a case where the virtual switches SW are detected with a skip in which a part of the successive virtual switches is not detected (skip presence). The skip occurs when, for example, a user rapidly performs a slide operation. The touch operations include that in a case where one of the virtual switches SW is touched (hand shake absence), and that in a case where the plurality of virtual switches SW is touched caused by vibration of the input apparatus 30 and the like (hand shake presence).

Figure 5:
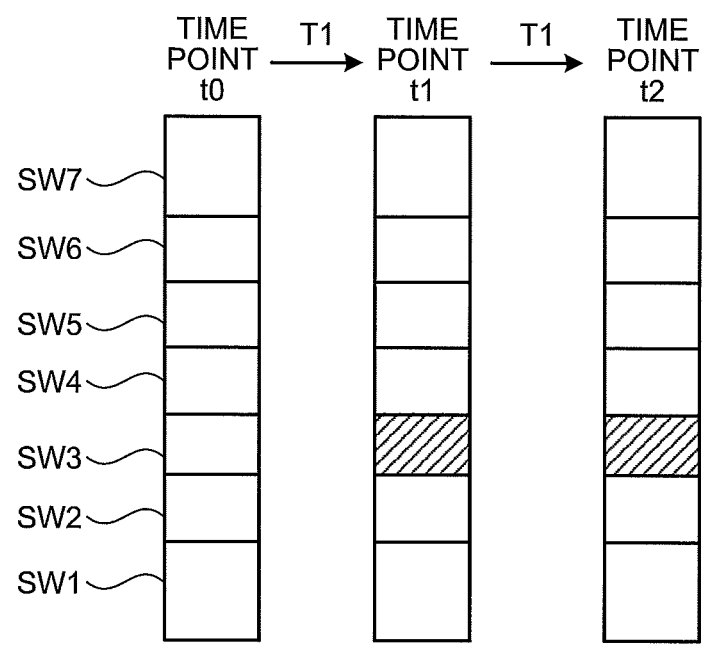
FIGS. 5, 6A, and 6B are diagrams illustrating touch operations to be detected by an operation detecting unit according to the embodiment.

First, a case in which the operation detecting unit 322 detects a touch operation without hand shake will be explained with reference to FIG. 5. FIG. 5 is a diagram illustrating a touch operation to be detected by the operation detecting unit 322 according to the present embodiment. The operation detecting unit 322 is assumed to detect an input operation performed by a user with, for example, the predetermined period T1. In FIG. 5, each of the virtual switches SW having a contact with a user is indicated by using filling diagonal lines. In FIG. 5, illustration of reference symbols of the same configuration at different time points is omitted, and FIGS. 6A to 8, and 10 are also the same.

When detecting, from a state in which the contact detecting unit 321 does not detect the virtual switch SW having a contact with a user, the virtual switch SW having a contact with the user at the next time point, the operation detecting unit 322 detects a touch operation of the detected virtual switch SW.

For example, as illustrated in FIG. 5, it is assumed that the virtual switch SW having a contact with a user at a time point t0 does not exist and the contact detecting unit 321 detects the virtual switch SW3 having a contact with the user at the next time point t1 when the predetermined period T1 is elapsed from the time point t0.

In this case, the operation detecting unit 322 detects a touch operation of the virtual switch SW3.

When the virtual switches SW detected by the contact detecting unit 321 at the present time and at the last time are the same, the operation detecting unit 322 detects a touch operation of the virtual switch SW.

For example, as illustrated in FIG. 5, it is assumed that the contact detecting unit 321 detects the virtual switch SW3 having a contact with a user at the time point t2. This detection result is the same as the virtual switch SW3 detected at the last time point t1. Thus, the operation detecting unit 322 detects the touch operation of the virtual switch SW3 at the time point t2.

Thus, the operation detecting unit 322 detects a touch operation of the virtual switch SW whose contact is detected when the contact detecting unit 321 detects a new contact or when the contact detecting unit 321 continuously detects contacts of the same virtual switch SW.

Herein, the operation detecting unit 322 detects a touch operation when the contact detecting unit 321 detects a new contact, however, not limited thereto. The operation detecting unit 322 may detect a touch operation of the virtual switch SW when, for example, the contact detecting unit 321 continuously detects contacts of the same virtual switch SW for predetermined times.

Thus, for example, a touch operation is hardly detected erroneously when, for example, a user erroneously contacts with the virtual switch SW, and thus accuracy in detection, by the operation detecting unit 322, of a touch operation can be improved.

Figure 6A:
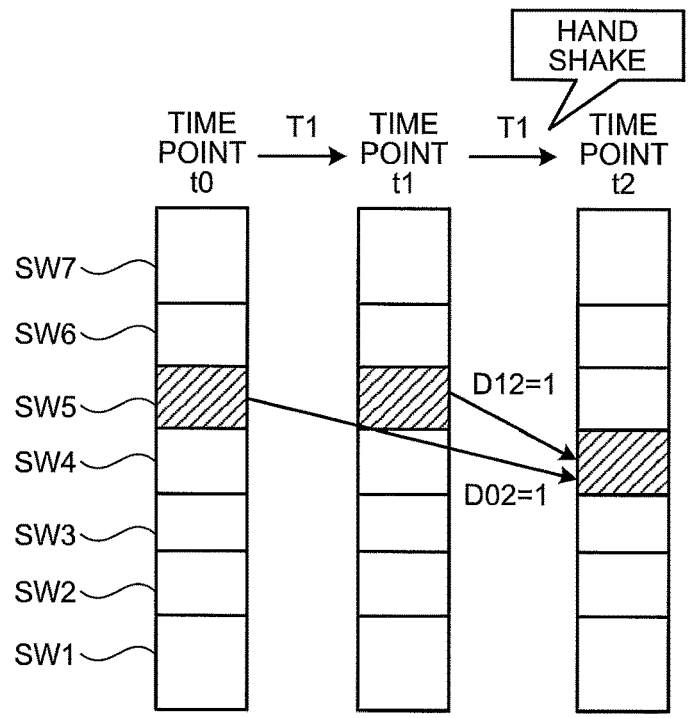
Figure 6B:
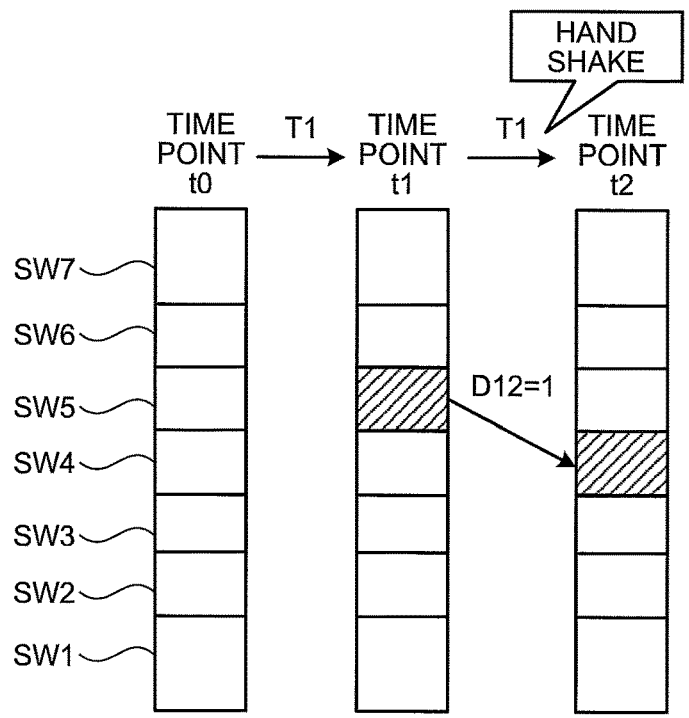

A case in which the operation detecting unit 322 detects a touch operation in a case where hand shake occurs will be explained with reference to FIGS. 6A and 6B. FIGS. 6A and 6B are diagrams illustrating touch operations to be detected by the operation detecting unit 322 according to the present embodiment.

A case will be explained with reference to FIG. 6A, in which hand shake occurs in a state where a user touches the virtual switch SW5 and then the user touches the virtual switch SW4.

In this case, as illustrated in FIG. 6A, the contact detecting unit 321 detects the virtual switch SW5 having a contact with a user at the time point t0, and further detects the virtual switch SW5 at the next time point t1. Thus, the operation detecting unit 322 detects a touch operation of the virtual switch SW5 at the time point t1.

It is assumed that hand shake occurs between the time points t1 and t2 and the contact detecting unit 321 detects the virtual switch SW4 that has a contact with a user at the time point t2. In this case, the virtual switch SW to be detected by the contact detecting unit 321 at the present time point t2 is different from that detected at the last time point t1.

Herein, for example, it is assumed that the operation detecting unit 322 detects a touch operation only when the same virtual switch is continuously detected, the operation detecting unit 322 erroneously detects a slide operation.

Therefore, when the virtual switch SW4 detected by the contact detecting unit 321 at the present time point t2 is different form the virtual switch SW5 detected at the last time point t1, the operation detecting unit 322 according to the present embodiment detects a touch operation in accordance with the virtual switch SW detected before the last time. More specifically, when a distance to the virtual switch SW detected at the last time is less than the first threshold Th1 and a distance to the virtual switch SW detected before the last time is less than a second threshold Th2, the operation detecting unit 322 detects a touch operation.

In the example illustrated in FIG. 6A, first, the operation detecting unit 322 compares the distance D12 between the virtual switch SW4 detected at the present time point t2 and the virtual switch SW5 detected at the last time point t1 with the first threshold Th1.

Herein, a distance between the virtual switches SW is indicated by the number of the virtual switches SW. For example, when the number of the virtual switches SW is successive, for example, the virtual switches SW1 to SW7, difference in the number corresponds to the distance between the virtual switches SW. Therefore, for example, the distance D12 between the virtual switch SW4 detected at the time point t2 and the virtual switch SW5 detected at the time point t1 satisfies "D12 (=5−4)=1." The first threshold Th1 is assumed to satisfy, for example, "Th1=2."

As described above, the distance D12 between the virtual switch SW4 detected at the time point t2 and the virtual switch SW5 detected at the time point t1 satisfies "D12=1," and is less than the first threshold Th1. In this case, the operation detecting unit 322 detects a touch operation in accordance with the virtual switch SW detected before the last time (in FIG. 6A, time point t0 at last but one time). When the distance D12 is equal to or more than the first threshold Th1, a slide operation is detected as described below with reference to FIG. 7.

Next, the operation detecting unit 322 compares a distance D02 between the virtual switch SW5 detected at the last but one time point t0 and the virtual switch SW4 detected at the present time point t2 with the second threshold Th2. Herein, the second threshold Th2 is assumed to satisfy, for example, "Th2=2." In the example illustrated in FIG. 6A, the distance D02 between the virtual switch SW5 detected at the last but one time point t0 and the virtual switch SW4 detected at the present time point t2 satisfies "D02=1," and is less than the second threshold Th2.

In this case, the operation detecting unit 322 detects, at the present time point t2, a touch operation of the virtual switch SW5 detected at the last time point t1. In other words, when the virtual switch SW4 detected at the present time is not largely away from the virtual switch SW5 detected at the last and the last but one times, the operation detecting unit 322 continuously detects, in the estimation that hand shake occurs, a touch operation of the virtual switch SW5 that is the same as that detected at the last time.

The contact detecting unit 321 determines the virtual switch SW5 as a virtual switch on which a contact with a user is detected at the present time point t2. Thus, when a user performs, not hand shake, a slide operation, this slide operation can be detected with high accuracy. This point will be mentioned later with reference to FIG. 10. When the distance D02 is equal to or more than the second threshold Th2, a slide operation is detected as described below with reference to FIG. 8.

Thus, even when hand shake occurs, the operation detecting unit 322 can detect a touch operation, so that it is possible to reduce erroneous detection of an input operation performed by a user. Thus, the operation detecting unit 322 can improve operability of a user.

For example, there exists a case where hand shake occurs when a user first performs a touch operation. In this case, as illustrated in FIG. 6B, for example, the contact detecting unit 321 does not detect the virtual switch SW having a contact with a user at the time point t0, and detects the virtual switch SW5 having a contact with a user at the next time point t1. The contact detecting unit 321 detects the virtual switch SW4 having a contact with the user at the next time point t2. Thus, the operation detecting unit 322 first detects a touch operation of the virtual switch SW5 at the time point t1.

At the time point t2, the contact detecting unit 321 detects the virtual switch SW4 having a contact with a user, and this virtual switch SW4 is away from the virtual switch SW5 detected at the time point t1 by the distance D12 that satisfies "distance D12=1 (D12<Th1)." Thus, the operation detecting unit 322 detects an input operation of the time point t2 in accordance with a detection result at the last but one time point t0. At the time point t0 illustrated in FIG. 6B, a user does not contact with any of the virtual switches SW. Thus, when the contact detecting unit 321 does not detect any of the virtual switches SW having a contact with a user at the last but one time point t0, the operation detecting unit 322 continuously detects a touch operation of the virtual switch SW5 detected at the last time point t1 as an input operation of the present time point t2.

Thus, in a case where a user first performs a touch, namely, a contact with the user is not detected at the last but one time, a touch operation can be detected even when hand shake occurs.

Figure 7:
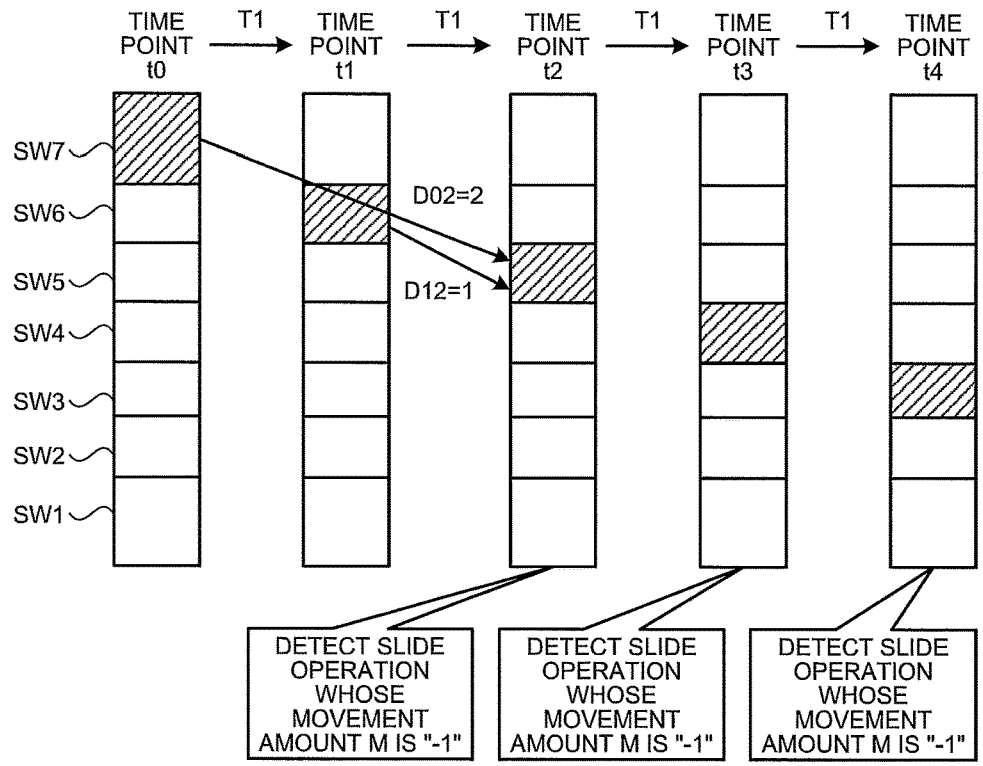
FIGS. 7 and 8 are diagrams illustrating slide operations to be detected by the operation detecting unit according to the embodiment.
Figure 8:
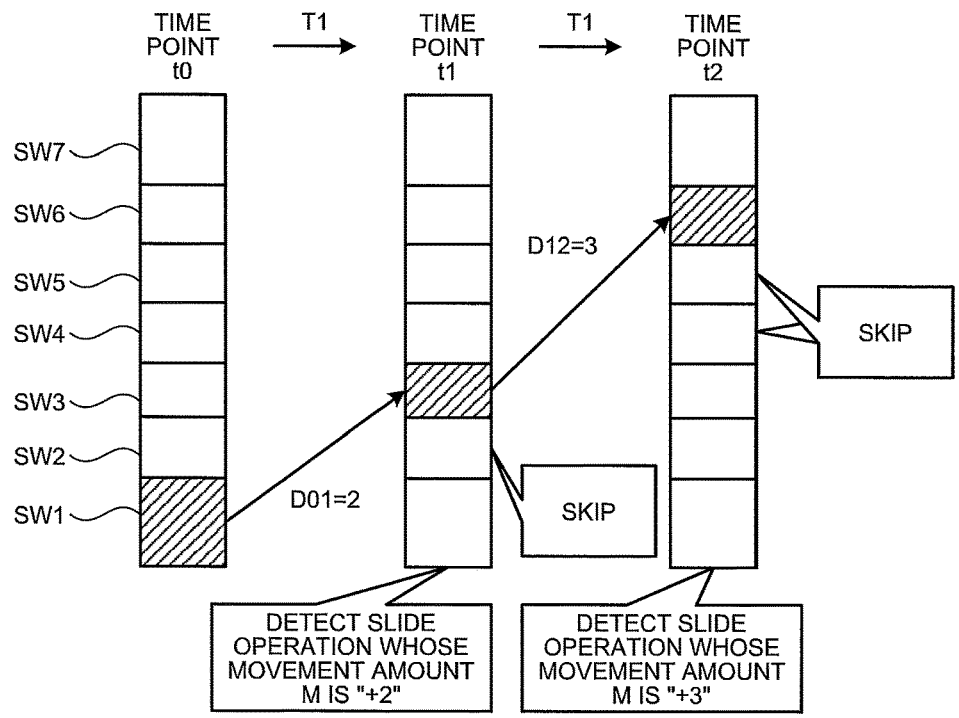

Next, cases will be explained with reference to FIGS. 7 and 8, in which the operation detecting unit 322 detects slide operations. FIGS. 7 and 8 are diagrams illustrating slide operations to be detected by the operation detecting unit 322 according to the present embodiment.

First, a case will be explained with reference to FIG. 7, in which the operation detecting unit 322 detects a slide operation without a skip. Herein, a user is assumed to slide a finger and the like from the virtual switch SW7 to the virtual switch SW3 so as to perform a slide operation.

In this case, as illustrated in FIG. 7, the contact detecting unit 321 sequentially detects, for example, the virtual switches SW7→SW6→SW5→SW4→SW3 one by one in response to a slide operation of a user. In other words, the contact detecting unit 321 detects the virtual switch SW7 at the time point t0. The contact detecting unit 321 detects the virtual switch SW6 at the time point t1, and detects the virtual switch SW5 at the time point t2. The contact detecting unit 321 detects the virtual switch SW4 at the time point t3, and detects the virtual switch SW3 at the time point t4.

An input operation to be detected by the operation detecting unit 322 at the time point t2 will be explained. At the time points t0 and t1, the operation detecting unit 322 detects input operations in accordance with the virtual switches SW detected by the contact detecting unit 321 before the time point t0, and thus explanation thereof is omitted.

At the time point t2, the virtual switch SW5 detected by the contact detecting unit 321 is different from the virtual switch SW6 detected at the last time point t1. In this case, the operation detecting unit 322 compares the distance D12 between the virtual switch SW5 detected at the present time point t2 and the virtual switch SW6 detected at the last time point t1 with the first threshold Th1. Herein, the first threshold Th1 is assumed to satisfy, for example, "Th1=2."

In the example illustrated in FIG. 7, the distance D12 is "1" and less than the first threshold Th1. In this case, the operation detecting unit 322 detects a slide operation in accordance with the virtual switch SW detected before the last time (in FIG. 7, last but one time point t0). When the distance D12 is equal to or more than the first threshold Th1 or more, a slide operation is detected as described below with reference to FIG. 8.

The operation detecting unit 322 compares the distance D02 between the virtual switch SW7 detected at the last but one time point t0 and the virtual switch SW5 detected at the present time point t2 with the second threshold Th2. Herein, the second threshold Th2 is assumed to satisfy, for example, "Th2=2." In the example illustrated in FIG. 7, the distance D02 between the virtual switch SW7 detected at the last but one time point t0 and the virtual switch SW5 detected at the present time point t2 satisfies "D02=2", and is equal to or more than the second threshold Th2.

In this case, the operation detecting unit 322 detects a slide operation at the present time point t2. When detecting the slide operation, the operation detecting unit 322 further detects a direction of the slide operation. Specifically, the operation detecting unit 322 detects a slide operation of a movement amount M obtained by, for example, providing to the distance D12 a sign indicating a direction. For example, in FIG. 7, a user slides a finger and the like in a downward direction so as to perform a slide operation. Therefore, the operation detecting unit 322 detects a slide operation whose movement amount M is "−1." When the distance D02 is less than the second threshold Th2, a touch operation is detected as described above with reference to FIGS. 6A and 6B.

Similarly, the operation detecting unit 322 detects slide operations whose movement amounts M are "−1" at the respective time points t3 and t4.

Thus, the operation detecting unit 322 detects a slide operation in accordance with the virtual switch SW detected by the contact detecting unit 321 before the last time, and thus each of the slide operation and the touch operation with hand shake can be detected with high accuracy. Thus, the operation detecting unit 322 can improve operability of a user.

Next, a slide operation to be detected by the operation detecting unit 322 when a skip occurs will be explained with reference to FIG. 8.

For example, as illustrated in FIG. 8, it is assumed that the contact detecting unit 321 detects the virtual switch SW1 at the time point t0, and further detects the virtual switch SW3 at the time point t1 when the predetermined period T1 is elapsed from the time point t0. In this case, the contact detecting unit 321 skips the virtual switch SW2. Moreover, it is assumed that the contact detecting unit 321 detects the virtual switch SW6 at the next time point t2. In this case, the contact detecting unit 321 has skipped the virtual switches SW4 and SW5.

Herein, for example, it is assumed that the operation detecting unit 322 detects a slide operation when the virtual switch SW having a contact with a user moves one by one, if such a skip as that illustrated in FIG. 8 occurs, a slide operation is not detected.

Therefore, when the virtual switch SW detected at the present time moves from the virtual switch SW detected at the last time by a distance that is equal to or more than the first threshold Th1, the operation detecting unit 322 according to the present embodiment detects a slide operation according to the movement amount M in the movement.

Specifically, the operation detecting unit 322 computes a distance between the virtual switch SW detected at the present time and the virtual switch SW detected at the last time. For example, at the time point t1 illustrated in FIG. 8, the operation detecting unit 322 computes a distance D01 between the virtual switch SW3 detected at the present time point t1 and the virtual switch SW1 detected at the last time point t0. In this case, the distance D01 satisfies "D01=2."

The operation detecting unit 322 compares the distance D01 with the first threshold Th1, when the distance D01 is equal to or more than the first threshold Th1, the operation detecting unit 322 detects a slide operation according to the distance D01 and the moving direction. In the example illustrated in FIG. 8, a user slides a finger and the like in an upward direction by the distance D01 (D01=2) so as to perform a slide operation. In this case, when the first threshold Th1 is assumed to satisfy "Th1=2," the operation detecting unit 322 detects a slide operation that satisfies "the movement amount M=+2" at the time point t1.

Similarly, at the time point t2 illustrated in FIG. 8, a slide operation that satisfies "the movement amount M=+3" is detected in accordance with the distance D12 (D12=3) between the virtual switch SW6 detected at the present time point t2 and the virtual switch SW3 detected at the last time point t1.

Thus, when a distance between the virtual switch SW detected at the present time and the virtual switch SW detected at the last time is equal to or more than the first threshold Th1, the operation detecting unit 322 detects a slide operation according to this distance and the moving direction. Thus, the operation detecting unit 322 can detect a slide operation even when a skip occurs, so that it is possible to improve operability of a user.

With reference to an operation correspondence table illustrated in FIG. 9, the relation between distances D between the virtual switches SW detected with the predetermined period T1 and input operations to be detected by the operation detecting unit 322 will be explained. FIG. 9 is a table illustrating correspondence relation between distances between the virtual switches SW and the input operations to be detected by the operation detecting unit 322. Herein, as one example, a present time point is decided to be the time point t2, the same can be decided to another time point.

As illustrated in FIG. 9, when the distance D12 between the virtual switches SW respectively detected by the contact detecting unit 321 at the present time point t2 and the last time point t1 satisfies "D12=0," in other words, when the contact detecting unit 321 detects the same virtual switch SW at the present and last times, the operation detecting unit 322 detects a touch operation.

A case will be explained, in which, as illustrated in FIG. 9, the distance D12 between the virtual switches SW respectively detected at the present time point t2 and the last time point t1 is larger than "0" and less than the first threshold Th1 (0<D12<Th1). In this case, the operation detecting unit 322 detects an input operation in accordance with the distance D02 between the virtual switches SW respectively detected at the present time point t2 and the last but one time point t0.

Specifically, when the distance D02 is less than the second threshold Th2 (D02<Th2), the operation detecting unit 322 detects a touch operation of the virtual switch SW detected at the time point t1. The operation detecting unit 322 detects a slide operation when the distance D02 is equal to or more than the second threshold Th2 (D02≥Th2).

When the distance D12 between the virtual switches SW respectively detected at the present time point t2 and the last time point t1 is equal to more than the first threshold Th1 (D12≥Th1), the operation detecting unit 322 detects a slide operation.

Thus, the operation detecting unit 322 detects an input operation in accordance with the distance D between the virtual switches SW detected with the predetermined period T1. Thus, accuracy in detection, by the operation detecting unit 322, of an input operation can be improved, so that it is possible to improve operability of a user.

Figure 10:
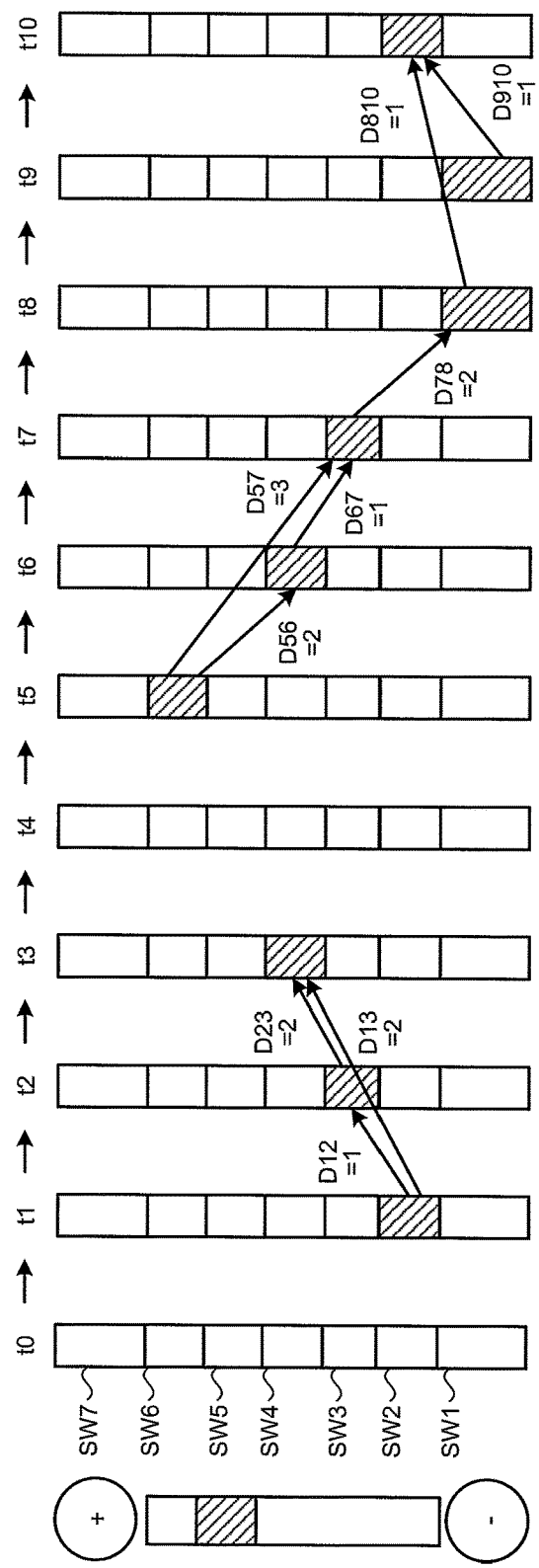
FIG. 10 is a diagram illustrating one example of input operations to be detected by the operation detecting unit according to the embodiment.

Herein, with reference to FIG. 10, one example of sequential input operations to be detected by the operation detecting unit 322 will be explained. A case will be explained here, in which the sound outputting device 20 adjusts the sound volume in accordance with an input operation detected by the operation detecting unit 322. FIG. 10 is a diagram illustrating one example of input operations to be detected by the operation detecting unit 322 according to the present embodiment.

As illustrated in FIG. 10, it is assumed that, among the virtual switches SW1 to SW7, a button for increasing the sound volume is assigned to the virtual switch SW7, and a button for decreasing the sound volume is assigned to the virtual switch SW1. Therefore, a user touches the virtual switch SW1 or SW7 to be able to adjust the sound volume.

Furthermore, it is assumed that a slide bar is assigned to the virtual switches SW2 to SW6. Therefore, a user slides a finger and the like over the virtual switches SW1 to SW7 to be able to adjust the sound volume. Specifically, for example, the sound volume increases when a user slides a finger and the like from the virtual switch SW2 toward the virtual switch SW6, on the other hand, the sound volume decreases when a user slides a finger and the like from the virtual switch SW6 toward the virtual switch SW2.

In FIG. 10, it is assumed that the sound volume is adjusted from a state where the sound volume is "30." It is assumed that a user performs a slide operation for increasing the sound volume, and then performs a slide operation for decreasing the sound volume. It is assumed that, after this slide operation, a user continue to perform a touch operation of the virtual switch SW1, namely, a long push to the virtual switch SW1, so as to perform an operation for decreasing the sound volume down to desired magnitude.

At the time point t0 illustrated in FIG. 10, a user does not contact with the virtual switch SW. Therefore, the contact detecting unit 321 does not detect any of the virtual switches SW having a contact with the user, and the operation detecting unit 322 does not detect any input operation. In this case, the sound outputting device 20 keeps the sound volume "30."

When the user next touches the virtual switch SW2 at the time point t1, the contact detecting unit 321 detects the virtual switch SW2. In this case, the operation detecting unit 322 detects a touch operation of the virtual switch SW2. The virtual switch SW2 is assigned to a slide bar, and thus, even when the touch operation of the virtual switch SW2 is detected, the sound outputting device 20 keeps the sound volume "30" without adjustment of the sound volume.

It is assumed that a slide of a finger and the like of a user in a direction for increasing the sound volume causes the contact detecting unit 321 to detect a contact between the virtual switch SW3 and the user at the time point t2. In this case, the virtual switch SW detected by the contact detecting unit 321 at the time point t1 is different from that detected at the time point t2, however, the contact detecting unit 321 does not detect a contact between the virtual switch SW and the user at the time point t0 that is the last but one time of the time point t2.

Thus, the operation detecting unit 322 detects a touch operation of the virtual switch SW2 at the time point t2 similarly to the case at the time point t1. It is assumed that the contact detecting unit 321 detects a contact between the virtual switch SW2 and the user at the time point t2, which is the same as that detected at the time point t1.

As described above, because the virtual switch SW2 is assigned to the slide bar, the sound outputting device 20 does not adjust the sound volume even when the touch operation of the virtual switch SW2 is detected, and keeps the sound volume "30."

Moreover, when the user slides a finger and the like in the direction for increasing the sound volume, the contact detecting unit 321 detects a contact between the virtual switch SW4 and the user at the time point t3. As described above, the contact detecting unit 321 detects the virtual switch SW2 at the time point t2, which is the same as that detected at the time point t1. Therefore, a distance D23 between the virtual switch SW2 detected by the contact detecting unit 321 at the last time point t2 and the virtual switch SW4 detected at the present time point t3 satisfies "D23=2," and the distance D23 is equal to or more than the first threshold Th1 (Th1=2).

Therefore, the operation detecting unit 322 detects, at the time point t3, a slide operation of the movement amount M (M=+2) in accordance with the distance D23 (D23=2) and the moving direction (in FIG. 10, direction for increasing sound volume). The sound outputting device 20 adjusts the sound volume in accordance with the slide operation of the movement amount M (M=+2) detected by the operation detecting unit 322. For example, the sound outputting device 20 adds the movement amount M (M=+2) to the sound volume "30" so as to turn the sound volume into "32".

As described above, the contact detecting unit 321 determines the virtual switch SW detected at the time point t2 as, not the actually-detected virtual switch SW3, the virtual switch SW2 detected at the last time point t1. Thus, the operation detecting unit 322 can detect, at the time point t3, the actual movement amount M (M=+2) of the user from the time point t1 to the time point t3. For example, it is assumed that the contact detecting unit 321 detects the virtual switch SW3 at the time point t2 and the operation detecting unit 322 detects an input operation of the time point t3. In this case, the operation detecting unit 322 detects a slide operation of the movement amount M (M=+1) in accordance with the distance D23 (D23=1) between the virtual switch SW3 detected at the time point t2 and the virtual switch SW4 detected at the time point t3 and the moving direction. Therefore, the movement amount M of the slide operation detected by the operation detecting unit 322 between the time points t1 and t3 satisfies "M=+1," and this movement amount M (M=+1) is smaller than the actual movement amount M (M=+2) of the user.

In a case where a touch operation is detected even when the virtual switch SW detected at the time point t1 is different form that detected at the time point t2, the contact detecting unit 321 according to the present embodiment determines the virtual switch SW detected at the time point t2 as, not the actually-detected virtual switch SW3, the virtual switch SW2 detected at the last time point t1. Thus, the operation detecting unit 322 can detect, at the time point t3, a slide operation of the movement amount M by which the user actually moved.

Next, when the user detaches a finger and the like from the virtual switch SW between the time points t3 and t4, the contact detecting unit 321 does not detect, at the time point t4, any contact between the virtual switch SW and the user. Therefore, the operation detecting unit 322 detects no input operation, and the sound outputting device 20 keeps the sound volume "32".

Next, when the user touches the virtual switch SW6 at a time point t5, the contact detecting unit 321 detects the virtual switch SW6. In this case, the operation detecting unit 322 detects a touch operation of the virtual switch SW6. The virtual switch SW6 is assigned to the slide bar, and thus the sound outputting device 20 does not adjust the sound volume even when the touch operation of the virtual switch SW6 is detected, and keeps the sound volume "32."

It is assumed that a rapid slide of a finger and the like of the user in the direction for decreasing the sound volume causes the contact detecting unit 321 to skip the virtual switch SW5 so as to detect a contact between the virtual switch SW4 and the user at a time point t6. In this case, a distance D56 between the virtual switch SW6 detected by the contact detecting unit 321 at the last time point t5 and the virtual switch SW4 detected at the present time point t6 satisfies "D56=2" and the distance D56 is equal to or more than the first threshold Th1 (Th1=2).

Therefore, the operation detecting unit 322 detects, at the time point t6, a slide operation of the movement amount M (M=−2) in accordance with the distance D56 (D56=2) and the moving direction (in FIG. 10, direction for decreasing sound volume). The sound outputting device 20 adds the movement amount M (M=−2) to the sound volume "32", for example, in accordance with the slide operation of the movement amount M (M=−2) detected by the operation detecting unit 322, so as to turn the sound volume into "30."

When the user slides a finger and the like in the direction for decreasing the sound volume, the contact detecting unit 321 detects, at a time point t7, a contact between the virtual switch SW3 and the user. In this case, a distance D67 between the virtual switch SW4 detected by the contact detecting unit 321 at the last time point t6 and the virtual switch SW3 detected at the present time point t7 satisfies "D67=1," and the distance D67 is less than the first threshold Th1 (Th1=2). A distance D57 between the virtual switch SW6 detected by the contact detecting unit 321 at the last but one time point t5 and the virtual switch SW3 detected at the present time point t7 satisfies "D57=3," and the distance D57 is equal to or more than the second threshold Th2 (Th2=2).

Therefore, the operation detecting unit 322 detects, at the time point t7, a slide operation of the movement amount M (M=−1) in accordance with the distance D67 (D67=1) and the moving direction. The sound outputting device 20 adds the movement amount M (M=−1) to the sound volume "30", for example, in accordance with the slide operation of the movement amount M (M=−1) detected by the operation detecting unit 322, so as to turn the sound volume into "29."

It is assumed that a rapid slide of a finger and the like of the user in the direction for decreasing the sound volume causes the contact detecting unit 321 to skip the virtual switch SW2 so as to detect a contact between the virtual switch SW1 and the user at a time point t8. In this case, a distance D78 between the virtual switch SW3 detected at the last time point t7 by the contact detecting unit 321 and the virtual switch SW1 detected at the present time point t8 satisfies "D78=2," and the distance D78 is equal to more than the first threshold Th1 (Th1=2).

Therefore, the operation detecting unit 322 detects, at the time point t8, a slide operation of the movement amount M (M=−2) in accordance with the distance D78 (D78=2) and the moving direction. The sound outputting device 20 adds the movement amount M (M=−2) to the sound volume "29", for example, in accordance with the slide operation of the movement amount M (M=−2) detected by the operation detecting unit 322, so as to turn the sound volume into "27."

Next, when the user holds the state where the virtual switch SW1 is touched, the contact detecting unit 321 detects a contact between the virtual switch SW1 and the user at a time point t9. In this case, the virtual switch SW1 detected at the last time point t8 by the contact detecting unit 321 is the same as that detected at the present time point t9, and thus the operation detecting unit 322 detects a touch operation of the virtual switch SW1. The button for decreasing the sound volume is assigned to the virtual switch SW1, and thus the sound outputting device 20 decreases the sound volume "27" by, for example, "1", so as to turn the sound volume into "26."

It is assumed that, for example, hand shake occurs after the time point t9, and the contact detecting unit 321 detects a contact between the virtual switch SW2 and the user at a time point t10. In this case, a distance D910 between the virtual switch SW1 detected at the time point t9 and the virtual switch SW2 detected at the time point t10 satisfies "D910=1," and the distance D910 is less than the first threshold Th1 (Th1=2). A distance D810 between the virtual switch SW2 detected at the present time point t10 and the virtual switch SW1 detected at the last but one time point t8 satisfies "D810=1," and the distance D810 is less than the second threshold Th2 (Th2=2).

Thus, the operation detecting unit 322 detects, at the time point t10, a touch operation of the virtual switch SW1 similarly to the case at the time point t9. It is assumed that the contact detecting unit 321 detects, at the time point t10, a contact between the virtual switch SW1 and the user, which is the same as that detected at the time point t9. The button for decreasing the sound volume is assigned to the virtual switch SW1, and thus the sound outputting device 20 decreases the sound volume "26" by, for example, "1", so as to turn the sound volume into "25."

Thus, the operation detecting unit 322 detects an input operation in accordance with a distance between the virtual switches SW detected with the predetermined period T1, so that it is possible to detect the input operation with high accuracy even when hand shake or a skip occurs. Thus, operability of a user can be improved.

Each of the intervals between sequential time points of the time points t0 to t10 illustrated in FIG. 10 are assumed be the same as the predetermined period T1. In FIG. 10, the sound outputting device 20 adjusts the sound volume by as much as the movement amount M, not limited thereto. For example, the sound volume may be adjusted by as much as the movement amount M multiplied by a predetermined coefficient.

Returning to FIG. 2, the storage 323 stores information, such as information on the first threshold Th1 and the second threshold Th2, which is needed for the processes to be executed by the units of the controller 320. The storage 323 stores results, such as the virtual switch SW detected by the contact detecting unit 321, of the processes executed by the units of the controller 320. The storage 323 includes a semiconductor memory element such as a Random Access Memory (RAM) and a flash memory, or a storage device such as a hard disk and an optical disk.

Figure 11:
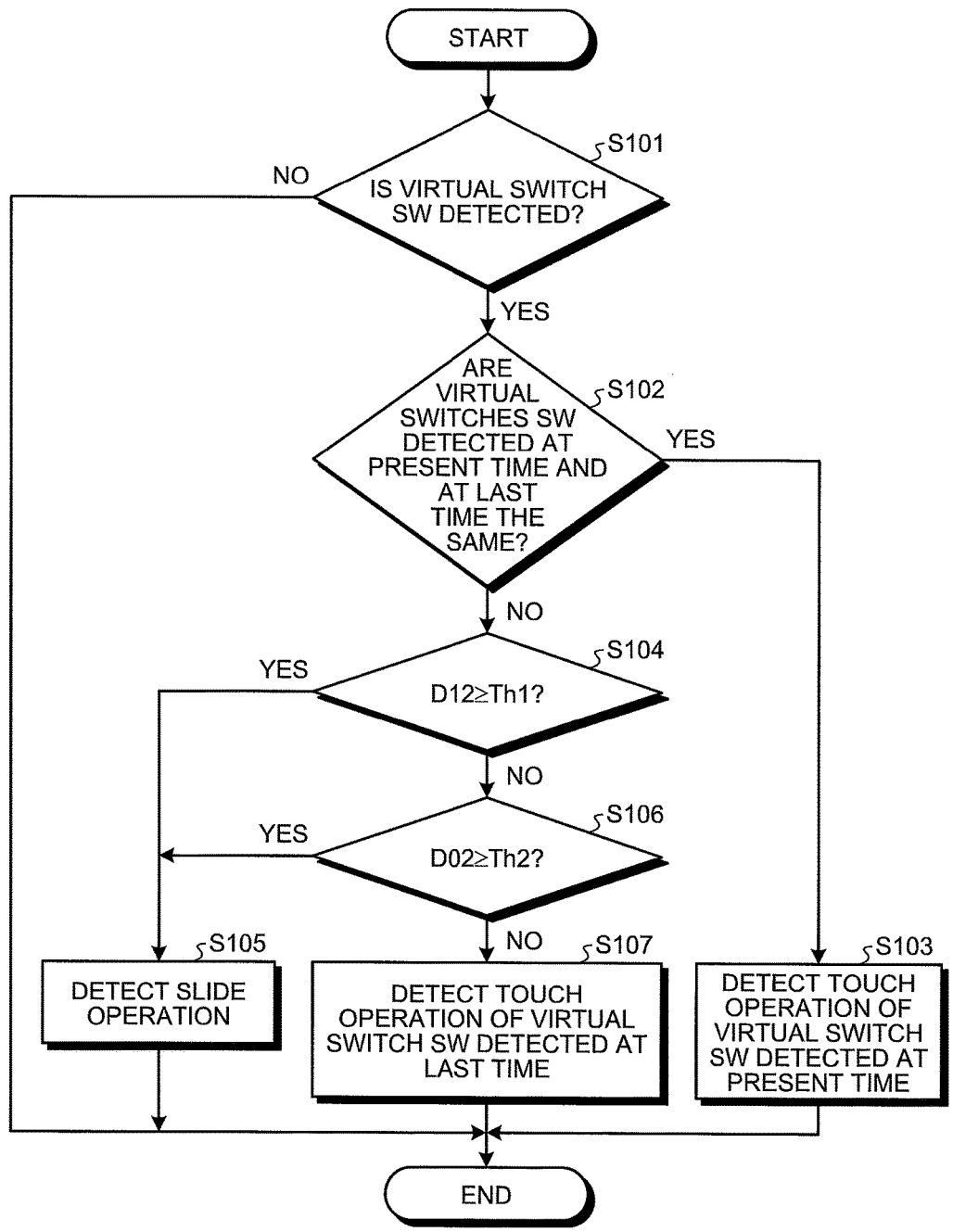
FIG. 11 is a flowchart illustrating a detecting process according to the embodiment.

The detecting process to be executed by the input apparatus 30 will be explained with reference to FIG. 11. FIG. 11 is a flowchart illustrating a detecting process according to the present embodiment. The input apparatus 30 repeatedly executes, with the predetermined period T1, the detecting process while, for example, the display device 10 or the sound outputting device 20 accepts an input operation by using the virtual switch SW.

The input apparatus 30 determines whether or not the contact detecting unit 321 detects the virtual switch SW having a contact with a user (Step S101). When the contact detecting unit 321 does not detect the virtual switch SW (Step S101: No), the input apparatus 30 terminates the process.

When the contact detecting unit 321 detects the virtual switch SW (Step S101: Yes), whether or not the virtual switches SW detected at the last time and at the present time are the same (Step S102). When the virtual switches SW detected at the last time and at the present time are the same (Step S102: Yes), the input apparatus 30 detects a touch operation of the virtual switch SW detected at the present time (Step S103), and terminates the process.

On the other hand, when the virtual switches SW detected at the last time and the present time are different from each other (Step S102: No), the input apparatus 30 determines whether or not the distance D12 between the virtual switch SW detected at the last time and that detected at the present time is equal to or more than the first threshold Th1 (Step S104).

When the distance D12 is equal to or more than the first threshold Th1 (Step S104: Yes), the input apparatus 30 detects a slide operation according to the distance D12 and the moving direction (Step S105), and terminates the process. On the other hand, when the distance D12 is less than the first threshold Th1 (Step S104: No), the input apparatus 30 determines whether or not the distance D02 between the virtual switch SW detected at the last but one time and that detected at the present time is equal to more than the second threshold Th2 (Step S106).

When the distance D02 is equal to or more than the second threshold Th2 (Step S106: Yes), the input apparatus 30 detects a slide operation according to the distance D12 and the moving direction (Step S105), and terminates the process.

On the other hand, when the distance D02 is less than the second threshold Th2 (Step S106: No), the input apparatus 30 detects a touch operation of the virtual switch SW detected at the last time (Step S107), and terminates the process.

As described above, the input apparatus 30 according to the present embodiment detects a slide operation or a touch operation in accordance with a distance between the virtual switch SW detected at the present time and that detected at the last time. Thus, the input apparatus 30 can detect a slide operation or a touch operation with high accuracy even when hand shake or a skip occurs, so that it is possible to improve operability of a user.

In the aforementioned embodiment, a period of the sensor unit 310 for detecting a contact with a user, a period of the contact detecting unit 321 for detecting the virtual switch SW having a contact with a user, and a period of the operation detecting unit 322 for detecting an input operation are the same as the predetermined period T1, not limited thereto. The contact detecting unit 321 and the operation detecting unit 322 may detect the virtual switch SW and the like with a period that is longer than the predetermined period T1, and this period may be changed.

Alternatively, for example, a period when a user performs an operation on the information processing system 1 may be set to be the predetermined period T1, and a period when a user does not performs thereon any operation may be set to be a period T2 that is longer than the predetermined period T1. Thus, for example, when the period is changed in accordance with presence/absence of an operation performed by a user, consumed power of the input apparatus 30 can be reduced.

In the aforementioned embodiment, the contact sensors 311 to 314 of the sensor unit 310 are arranged along a side of the display device 10, however, not limited thereto. For example, the contact sensors 311 to 314 may be arranged at positions where a driver can easily operate the sensors, such as a steering wheel and a neighborhood of a shifter on a center console.

The contact sensors 311 to 314 may be nonlinearly arranged in line, and may be arranged in line on a curved line such as a circumference of a circle. The contact sensors 311 to 314 may be arranged so that the sensors surround a periphery of the display device 10, for example. Alternatively, the contact sensors 311 to 314 may be annularly arrayed. Thus, it is sufficient that the contact sensors 311 to 314 are arrayed in any way, and the arrangement in line is not needed.

In the aforementioned embodiment, there exists no difference in level between the contact sensors 311 to 314, not limited thereto. It is sufficient that a slide operation of a user is accepted by using the contact sensors 311 to 314, and, for example, there may exist difference in level between the contact sensors 311 to 314.

In the aforementioned embodiment, the values of the first and second thresholds Th1 and Th2, which are compared with the distance D by the operation detecting unit 322 in order to detect an input operation, satisfy "Th1=Th2=2", not limited thereto. For example, the values of the first and second thresholds Th1 and Th2 may be changed in accordance with sizes of contact surfaces, which are to be in contact with a user, of the contact sensors 311 to 314. The values of the first and second thresholds Th1 and Th2 may be changed in accordance with a speed of a slide operation performed by a user. The values of the first and second thresholds Th1 and Th2 may be different from each other.

In the aforementioned embodiment, the contact detecting unit 321 detects the virtual switches SW1 to SW7 having a contact with a user, not limited thereto. For example, the contact detecting unit 321 may detect the contact sensors 311 to 314 having a contact with a user. In other words, when a contact with a user is detected by using each of the contact sensors 311 to 314 as a switch, the contact detecting unit 321 can detect a contact between the physical switch and the user.

In the aforementioned embodiment, the operation detecting unit 322 detects any one of a slide operation and a touch operation (with hand shake) in accordance with the virtual switch SW detected at the last but one time, not limited thereto. It is sufficient that an input operation is detected in accordance with the virtual switch SW detected before the last time, and the operation detecting unit 322 may detect an input operation in accordance with the virtual switch SW detected at, for example, the third or more last time.

For example, when a user slowly performs a slide operation, a time period during a contact between the one virtual switch SW and a user is long. Thus, a distance between the virtual switch SW detected at the last but one time and that detected at the present time becomes short, and there exists a probability that the operation detecting unit 322 may detects a touch operation with hand shake even when a user performs a slide operation. Thus, when the operation detecting unit 322 is set to detect a slide operation or a touch operation in accordance with the virtual switch SW detected at, for example, the third or more last time, a slide operation can be detected with high accuracy even when a user slowly performs a slide operation.

How long before the virtual switch SW is detected, which is according to an input operation detected by the operation detecting unit 322, may be changed in accordance with, for example, a speed of a slide operation of a user.

As described above, the input apparatus 30 according to the embodiment includes the contact detecting unit 321 and the operation detecting unit 322. The contact detecting unit 321 detects, with the predetermined period T1, the switch SW having a contact with a user among the plurality of arrayed switches SW1 to SW7. The operation detecting unit 322 detects, when among the plurality of arrayed switches SW1 to SW7 the switches SW detected by the contact detecting unit 321 at the present time and at the last time are different from each other, a touch operation or a slide operation on the basis of a distance between the switch SW detected at the present time and the switch SW detected at the last time.

Thus, even when a skip of one or more of the switches SW1 to SW7 or hand shake of a user occurs, the input apparatus 30 can detect an operation performed by the user with high accuracy. Thus, the input apparatus 30 can improve operability of the user.

The operation detecting unit 322 detects, when the distance between the switch SW detected at the present time and the switch SW detected at the last time is equal to or more than the first threshold Th1, the slide operation according to the distance.

Thus, the operation detecting unit 322 can detect a slide operation even when a skip occurs, and thus operability of the user can be improved.

The operation detecting unit 322 detects, when the distance between the switch SW detected at the present time and the switch SW detected at the last time is less than the first threshold Th1 and a second distance between the switch SW detected before the last time and the switch SW detected at the present time is equal to or more than the second threshold Th2, the slide operation according to the distance.

Thus, the operation detecting unit 322 can detect with high accuracy a slide operation while distinguishing the slide operation from a touch operation with hand shake, and thus operability of a user can be improved.

The operation detecting unit 322 detects, when the distance between the switch SW detected at the present time and the switch SW detected at the last time is less than the first threshold Th1 and a second distance between the switch SW detected before the last time and the switch SW detected at the present time is less than the second threshold Th2, the touch operation.

Thus, the operation detecting unit 322 can detect a touch operation even when hand shake occurs, and erroneous detection of an input operation performed by the user can be reduced. Thus, the operation detecting unit 322 can improve operability of the user.

The input apparatus 30 further includes the first and second contact sensors 311 and 312 that correspond to the successively-arranged first to third switches (virtual switches) SW1 to SW3 among the plurality of switches (virtual switches) SW1 to SW7 and each of which detects the contact of the user. When the first contact sensor 311 detects the contact, the contact detecting unit 321 detects a contact between the user and the first switch SW1. When the second contact sensor 312 detects the contact, the contact detecting unit 321 detects a contact between the user and the third switch SW3. When the first and second contact sensors 311 and 312 detect the contact, the contact detecting unit 321 detects a contact between the user and the second switch SW2 arranged between the first switch SW1 and the third switch SW3.

Thus, the number of the plurality of switches SW1 to SW7 that detect the contact with the user can be set to be larger than that of the plurality of contact sensors 311 to 314. Thus, resolution of the virtual switches SW1 to SW7 can be improved while reducing the number of the contact sensors 311 to 314.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An input apparatus comprising:
a processor programmed to:
    detect, with a predetermined period, a switch having a contact with a user among a plurality of switches that is arrayed, and
    detect a touch operation or a slide operation based on a distance between the switch detected at the present time and the switch detected at the last time, wherein
the processor is further programmed to:
    when the switch detected at the present time and the switch detected at the last time are different from each other, compare, with a first threshold, the distance between the switch detected at the present time and the switch detected at the last time;
    when the distance between the switch detected at the present time and the switch detected at the last time is equal to or more than the first threshold, detect the slide operation according to the distance; and
    when the distance between the switch detected at the present time and the switch detected at the last time is less than the first threshold, detect the touch operation for the switch detected at the last time.

2. The input apparatus according to claim 1, wherein
the processor is further programmed to:
    when the distance between the switch detected at the present time and the switch detected at the last time is less than the first threshold and a distance between a switch detected just before the last time and the switch detected at the present time is equal to or more than a second threshold, detect the slide operation according to the distance.

3. The input apparatus according to claim 1, wherein
the processor is further programmed to:
    when the distance between the switch detected at the present time and the switch detected at the last time is less than the first threshold and a distance between a switch detected just before the last time and the switch detected at the present time is less than a second threshold, detect the touch operation for the switch detected at the last time.

4. The input apparatus according to claim 1, further comprising
first and second contact sensors that correspond to successively-arranged first to third switches among the plurality of switches, each of the first and second contact sensors detecting the contact with the user, wherein
the processor is further programmed to:
    detect (i) a contact between the user and the first switch when the first contact sensor detects the contact, (ii) a contact between the user and the third switch when the second contact sensor detects the contact, and (iii) a contact between the user and the second switch arranged between the first and third switches when the first and second contact sensors detect the contact.

5. The input apparatus according to claim 1, wherein
the processor is further programmed to:
    change a specific control value by a predetermined value based on detection of the touch operation of one switch among the plurality of switches, and change the specific control value in response to the distance based on detection of the slide operation including the one switch.

6. The input apparatus according to claim 5, wherein the specific control value is a control value of a sound volume of an audio device.

7. A non-transitory computer-readable recording medium having stored therein a program that causes a computer to execute a process comprising:
    detecting, with a predetermined period, a switch having a contact with a user among a plurality of switches that is arrayed; and
    detecting a touch operation or a slide operation based on a distance between the switch detected at the present time and a switch detected at the last time, wherein
    the process further comprises:
        when the switch detected at the present time and the switch detected at the last time are different from each other, comparing, with a first threshold, the distance between the switch detected at the present time and the switch detected at the last time;
        when the distance between the switch detected at the present time and the switch detected at the last time is equal to or more than the first threshold, detecting the slide operation according to the distance; and
        when the distance between the switch detected at the present time and the switch detected at the last time is less than the first threshold, detecting the touch operation for the switch detected at the last time.

8. A detection method comprising:
    detecting, with a predetermined period, a switch having a contact with a user among a plurality of switches that is arrayed; and
    detecting a touch operation or a slide operation based on a distance between the switch detected at the present time and a switch detected at the last time, wherein
    the method further comprises:
        when the switch detected at the present time and the switch detected at the last time are different from each other, comparing, with a first threshold, the distance between the switch detected at the present time and the switch detected at the last time;
        when the distance between the switch detected at the present time and the switch detected at the last time is equal to or more than the first threshold, detecting the slide operation according to the distance; and
        when the distance between the switch detected at the present time and the switch detected at the last time is less than the first threshold, detecting the touch operation for the switch detected at the last time.

* * * * *